(12) United States Patent
Huang et al.

(10) Patent No.: US 11,567,103 B2
(45) Date of Patent: Jan. 31, 2023

(54) TESTING DEVICE (71) Applicant: Quanwise Microelectronics (Zhuhai) Co., Ltd., Zhuhai (CN)

(72) Inventors: Guangmin Huang, Zhuhai (CN); Wei Xie, Zhuhai (CN); Yongkang Xie, Zhuhai (CN)

(73) Assignee: QUANWISE MICROELECTRONICS (ZHUHAI) CO., LTD., Zhuhai (CN)

( * ) Notice: Subject to any disclaimer, the term of this patent is extended or adjusted under 35 U.S.C. 154(b) by 0 days.

(21) Appl. No.: 17/379,103

(22) Filed: Jul. 19, 2021

(65) Prior Publication Data

US 2022/0229089 A1 Jul. 21, 2022

(30) Foreign Application Priority Data

Jan. 21, 2021 (CN) .......................... 202110084171.7

(51) Int. Cl.
*G01R 1/067* (2006.01)
*G01R 1/073* (2006.01)

(52) U.S. Cl.
CPC ..... *G01R 1/06716* (2013.01); *G01R 1/07307* (2013.01)

(58) Field of Classification Search
CPC .................. G01R 1/06716; G01R 1/07307
See application file for complete search history.

(56) References Cited

U.S. PATENT DOCUMENTS

| 8,575,953 B2* | 11/2013 | Henry | H01R 12/7082 |
| | | | 324/755.05 |
| 10,794,933 B1* | 10/2020 | Sherry | G01R 1/0466 |
| 2010/0062662 A1* | 3/2010 | Osato | G01R 1/0466 |
| | | | 439/824 |

OTHER PUBLICATIONS

WO-2007052358-A1 English translation, Osato Eichi (Year: 2007).*

* cited by examiner

*Primary Examiner* — Paresh Patel
(74) *Attorney, Agent, or Firm* — Vorys, Sater, Seymour and Pease LLP; Khaled Shami

(57) ABSTRACT

A testing device is disclosed including a plurality of elastic members, a plurality of elastic terminals, and a plurality of terminal boards. Each elastic member is provided with an arc-shaped elastic deformation portion, at least one elastic terminal is arranged as one set and is clamped on one elastic member with an inner arc of the elastic deformation portion. Each terminal board is provided with a recess for accommodating one of the elastic members, the recess is provided with at least one arc-shaped groove each matched with a respective elastic terminal, an outer arc of the elastic deformation portion is embedded in a respective arc-shaped groove, each arc-shaped groove has an upper end extending to an upper surface of the terminal board, and a lower end extending to a lower surface of the terminal board.

7 Claims, 8 Drawing Sheets

TESTING DEVICE

CROSS-REFERENCE TO RELATED APPLICATIONS

This application is based on and claims the benefit of priority from Chinese Patent Application No. 2021100841717, filed on 21 Jan. 2021, the entirety of which is incorporated by reference herein.

TECHNICAL FIELD

The present disclosure relates to the field of detecting technologies, and more particularly, to a testing device.

BACKGROUND

For a testing fixture used for testing a chip, a connector or other PCBs (Printed Circuit Boards), electric signal transmission is implemented by using a spring probe or an elastic terminal in a complex shape. The spring probe has a spring contact member in its internal mechanical structure, which may form a multi-point contact inside the probe, resulting in multiple contact resistances. Addition of the multiple contact resistances leads to a relatively large total resistance, which will also be increased especially with the wear of the contact after the probe has been used for a period of time. In addition, a coil spring is used to provide an elastic force for the spring probe, and a shape of a coil structure forms an impedance or interference to an electric signal, which affects and weakens the transmission of an electric signal strength. The existing elastic terminal has a complex S shape, with elastic force being provided by a laminated rotating structure similar to a spring structure, and this shape also has various impedances or interferences in electrical performance, which affects and weakens the transmission of the electric signal strength. With continuous improvement of the current electrical signal communication technology, requirements on resistance value and interference for the existing conductor is becoming higher and higher, and the spring probe and the elastic terminal in the complex S shape cannot meet the requirements of electrical signal communication.

SUMMARY

The present disclosure aims to solve at least one of the technical problems in the existing technology. For this purpose, the present disclosure provides a testing device with a simple structure and no contact impedance inside.

A testing device according to the present disclosure includes: a plurality of elastic members; a plurality of elastic terminals each provided with an arc-shaped elastic deformation portion, wherein at least one of the elastic terminals is arranged as one set and is clamped on one of the elastic members with an inner arc of the elastic deformation portion; and a plurality of terminal boards, wherein each of the terminal boards is provided with a recess for accommodating one of the elastic members, the recess is provided with at least one arc-shaped groove each matched with a respective one of the elastic terminals, an outer arc of the elastic deformation portion is embedded in a respective one of the at least one arc-shaped groove, each of the at least one arc-shaped groove has an upper end extending to an upper surface of the terminal board, and a lower end extending to a lower surface of the terminal board.

The testing device according to the embodiment of the present disclosure at least has the following beneficial effects. By using the arc-shaped elastic terminal, the elastic recovery effect can be realized, and meanwhile, the total resistance value can be avoided from being excessively large due to the fact that the contact impedance can be avoided, and the electromagnetic interference will not occur, thereby reducing interference. By using the elastic member, the resilience for the elastic terminal can be better provided, and the elastic life of the elastic terminal can be further improved. By using the terminal board, the elastic terminals can be fixed and isolated, a product to be tested can be positioned and installed. Meanwhile, by using connection modes of clamping and embedding, the assembly can be simplified. The testing device has a simple structure and a high overall reliability.

According to some embodiments of the present disclosure, at least two of the elastic terminals are arranged as one set and are clamped on one of the elastic members in parallel; and each of the terminal boards is provided with at least two parallel arc-shaped grooves, in each of which a respective one of the at least two of the elastic terminals is embedded.

According to some embodiments of the present disclosure, the testing device further includes a fixing member, wherein the fixing member is provided with a plurality of fixing slots, each matched with a respective one of the terminal boards embedded in the fixing slot.

According to some embodiments of the present disclosure, every two fixing slots in the fixing member are arranged side by side.

According to some embodiments of the present disclosure, each of the elastic terminals has an upper end as a first connecting end and a lower end as a second connecting end, when the elastic terminal is embedded in a corresponding arc-shaped groove, the first connecting end extends out of the upper surface of the terminal board, and the second connecting end extends out of the lower surface of the terminal board.

According to some embodiments of the present disclosure, the first connecting end, the second connecting end, and the elastic deformation portion are of an integral structure.

According to some embodiments of the present disclosure, the elastic member is made of silica gel, rubber, or epoxy resin.

According to some embodiments of the present disclosure, a conductive coating layer is coated on a surface of the elastic terminal.

According to some embodiments of the present disclosure, the conductive coating layer is at least one of gold, platinum, silver, copper, aluminum, iron, beryllium, rhodium, palladium alloy, nickel alloy, graphene, or graphite.

The additional aspects and advantages of the present disclosure will be given in part in the following description, and will become apparent in part from the following description, or will be learned through the practice of the present disclosure.

BRIEF DESCRIPTION OF DRAWINGS

The above and/or additional aspects and advantages of the present disclosure will be apparent and easily understood from the description of the embodiments with reference to the following accompanying drawings, wherein.

Reference numerals: 100 refers to elastic member, 200 refers to elastic terminal, 210 refers to elastic deformation portion, 211 refers to outer arc of elastic deformation portion, 220 refers to first connecting end, 230 refers to second connecting end, 300 refers to terminal board, 301 refers to upper surface of terminal board, 302 refers to lower surface of terminal board, 310 refers to recess, 320 refers to arc-shaped groove, 400 refers to fixing member, and 410 refers to fixing slot.

DETAILED DESCRIPTION

This part will describe the specific embodiments of the present disclosure in detail, and the preferred embodiments of the present disclosure are shown in the accompanying drawings. The accompanying drawings are used to supplement the description of the text in the description with the graphs, so that people can intuitively and vividly understand each technical feature and the overall technical solution of the present disclosure, but the accompanying drawings cannot be understood as limiting the scope of protection of the present disclosure.

In the description of the present disclosure, it shall be understood that the orientation or position relation related to the orientation description, such as the orientation or position relation indicated by the upper, lower, front, rear, left, right, etc., is based on the orientation or position relation shown in the drawings, which is only for convenience of description of the present disclosure and simplification of description, instead of indicating or implying that the indicated device or element must have a specific orientation, and be constructed and operated in a specific orientation, and thus shall not be understood as a limitation to the present disclosure.

In the description of the present disclosure, "certain" means one or more, "a plurality of" means two or more, and "greater than", "less than", "more than", etc. are understood as excluding the number itself, "above", "below", "within", etc. are understood as including the number itself. "First", "second", etc., if referred to, are for the purpose of distinguishing technical features only, cannot be understood as indicating or implying a relative importance or implicitly indicating the number of technical features indicated or implicitly indicating the precedence of technical features indicated.

In the description of the present disclosure, unless otherwise clearly defined, terms such as "arrange", "mount", "connect" should be understood in a broad sense, and those skilled in the art can reasonably determine the specific meanings of the above terms in the disclosure by combining the specific contents of the technical solutions.

With reference to FIG. 1 to FIG. 4, a testing device according to an embodiment of the present disclosure includes a plurality of elastic members 100, a plurality of elastic terminals 200, and a plurality of terminal boards 300.

The elastic terminals 200 are provided with an arc-shaped elastic deformation portion 210, at least one elastic terminal 200 is arranged as one set and is clamped on one elastic member 100, and an inner arc of the elastic deformation portion 210 is clamped on the corresponding elastic member 100. Each terminal board 300 is provided with a recess 310 for accommodating the elastic member 100, the recess 310 is provided with at least one arc-shaped groove 320, and the arc-shaped groove 320 on each terminal board 300 is matched with the elastic terminal 200 on the corresponding elastic member 100. Specifically, a shape of the arc-shaped groove 320 is matched with a shape of the corresponding elastic terminal 200, and the number of the arc-shaped grooves 320 on each recess 310 is matched with the number of the elastic terminals 200 on the same elastic member 100. An outer arc 211 of the elastic deformation portion 210 is embedded in the corresponding arc-shaped groove 320, an upper end of the arc-shaped groove 320 extends to an upper surface 301 of the terminal board 300, and a lower end of the arc-shaped groove 320 extends to a lower surface 302 of the terminal board 300.

With the arc-shaped groove 320 extending to the upper and lower surfaces 301, 302 of the terminal board 300, one end of the elastic terminal 200 can be electrically contacted with a PAD (bonding pad) testing point of a product to be tested, the other end of the elastic terminal 200 can be electrically contacted with a PAD testing point of a PCB board, and the PCB is electrically connected with detection through a cable, thus meeting a requirement of electrical test. The testing device mainly functions as a locating socket for the product to be tested, so as to improve testing efficiency. When two ends of the elastic terminal 200 are respectively butted with the electrical contact of the corresponding PAD testing point of the product to be tested or the corresponding PAD testing point of the PCB board, upper and lower ends of the elastic terminal 200 may approach each other, which, cooperating with the elastic member 100, can provide a resilience for the elastic terminal to restore the elastic terminal 200 to an original position, and improves an elastic life of the elastic terminal 200 at the same time. Cooperation of the elastic terminal 200 with the elastic member 100 enables to utilize an elastic force from elastic recovery so as to ensure that the elastic terminal 200 is closely contacted with the corresponding PAD point, so as to improve a reliability of detection.

It is noted that during electrical connection, the PAD testing point of the product to be tested and the PAD testing point of the PCB board may be inserted into the corresponding arc-shaped groove 320 to be electrically connected with the corresponding elastic terminal 200, or two ends of the corresponding elastic terminal 200 may extend out of the arc-shaped groove 320 to be electrically connected with the corresponding PAD testing point of the product to be tested and the corresponding PAD testing point of the PCB board.

Figure 2:
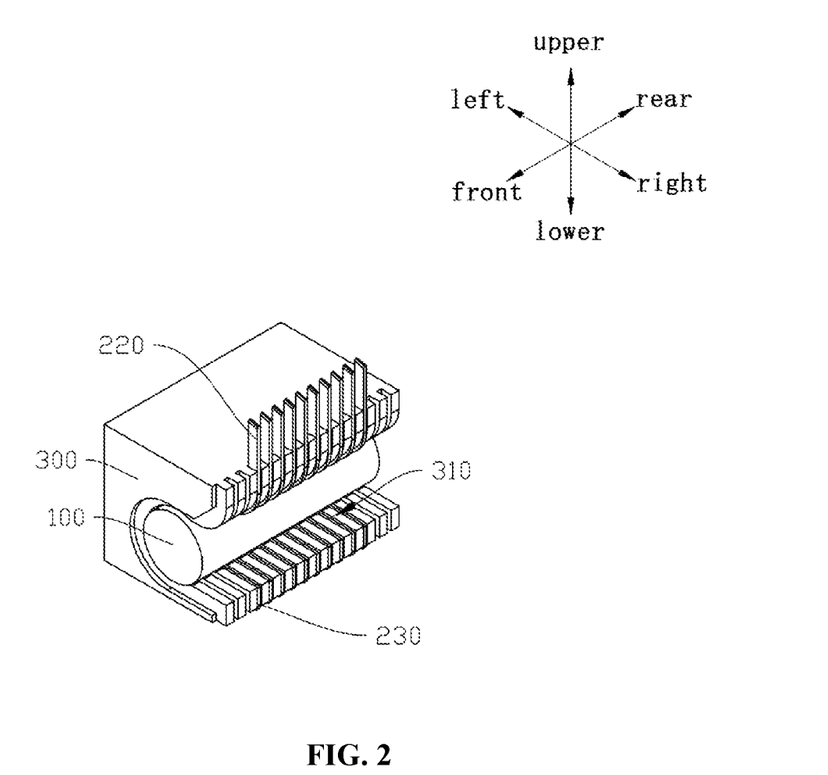
FIG. 2 is a schematic diagram of the testing device shown in FIG. 1 in an assembly state.

With reference to FIG. 2, in some embodiments of the present disclosure, at least two elastic terminals 200 are arranged as one set and are clamped on one elastic member 100 in parallel; and the terminal board 300 is provided with at least two parallel arc-shaped grooves 320, and the elastic terminal 200 is embedded in the corresponding arc-shaped groove 320.

According to PAD testing points of different products to be tested, a corresponding number of elastic terminals 200 and arc-shaped grooves 320 may be provided to be matched with a corresponding product to be tested.

In addition, since distribution and number of the PAD testing points on different products to be tested may have different combinations, different combinations of elastic terminals 200 at the same interval may be provided at the same time, which can conveniently adapt to the PAD testing points of different products to be tested, thus improving an applicability.

Figure 1:
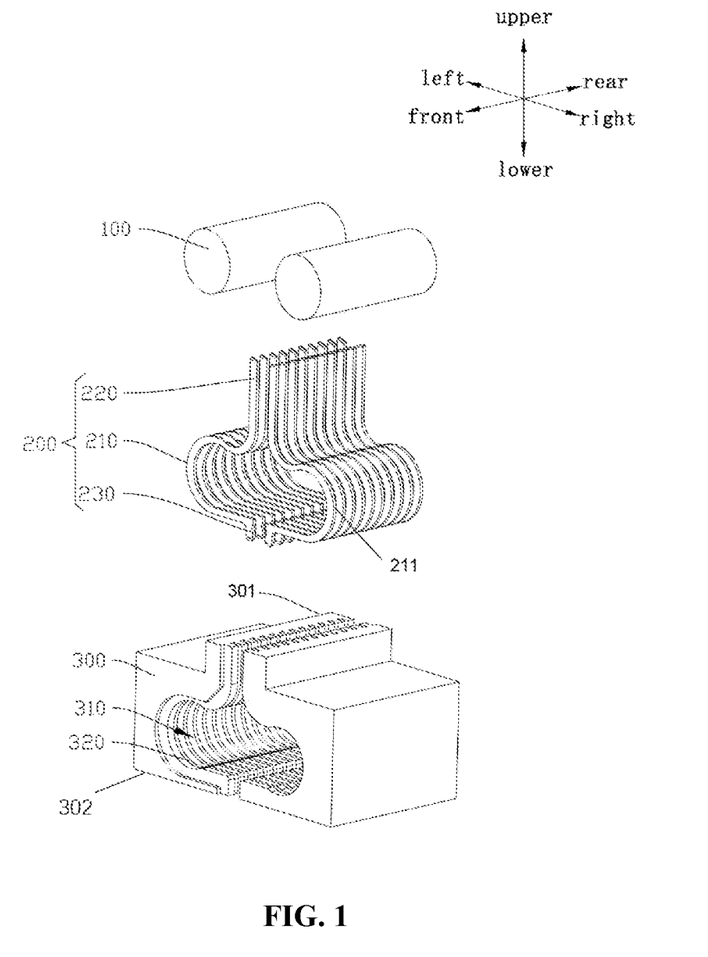
FIG. 1 is an exploded view of a testing device according to an embodiment of the present disclosure.
Figure 3:
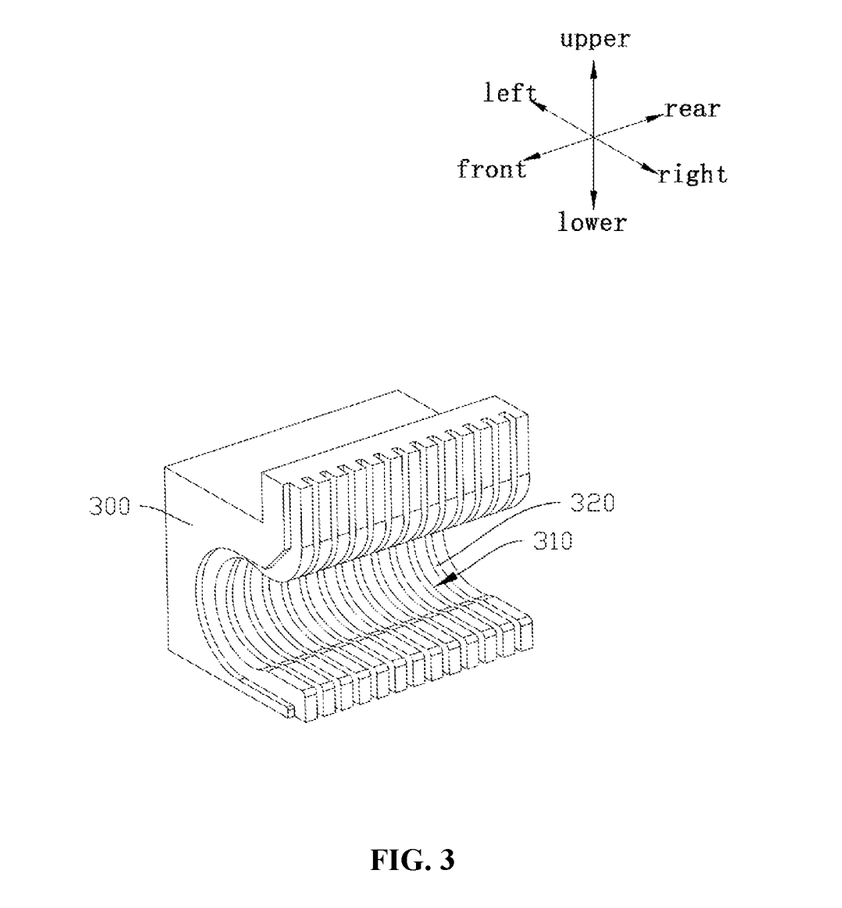
FIG. 3 is a schematic diagram of a structure of a terminal board of the testing device shown in FIG. 1.
Figure 4:
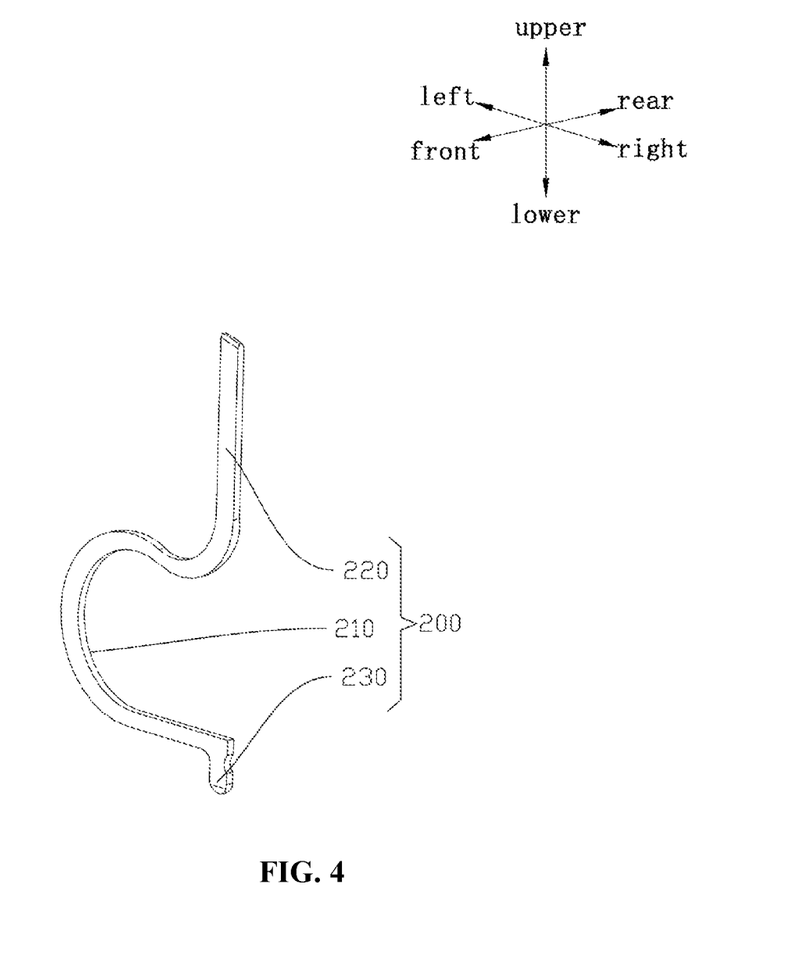
FIG. 4 is a schematic diagram of a structure of an elastic terminal of the testing device shown in FIG. 1.
Figure 5:
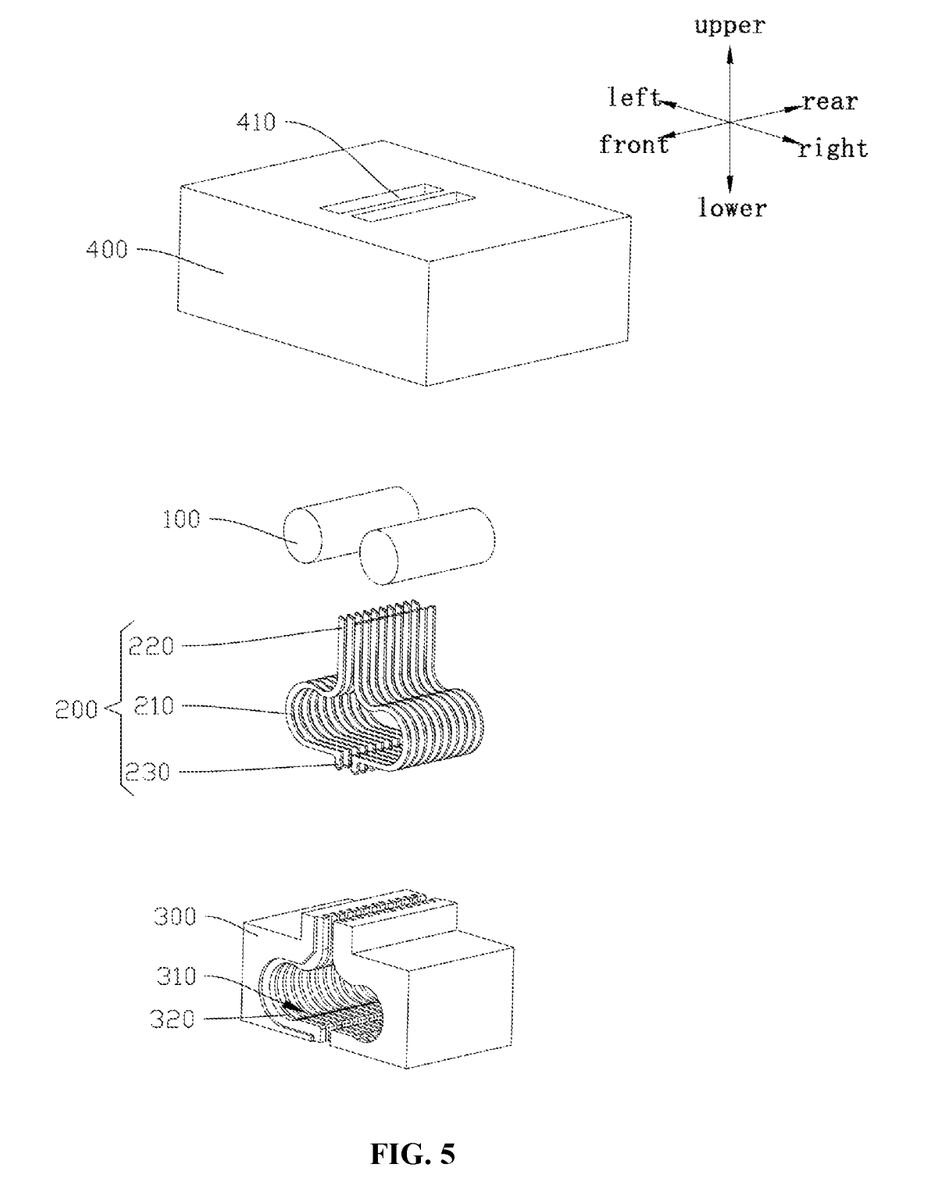
FIG. 5 is an exploded view of a testing device according to another embodiment of the present disclosure.

With reference to FIG. 1, FIG. 2, and FIG. 3, in some embodiments of the present disclosure, an upper end of the elastic terminal 200 is a first connecting end 220, a lower end of the elastic terminal 200 is a second connecting end 230. When the elastic terminal 200 is embedded in the corresponding arc-shaped groove 320, the first connecting end 220 extends out of the upper surface 301 of the terminal board 300, and the second connecting end 230 extends out of the lower surface 302 of the terminal board 300. The first connecting end 220 and the second connecting end 230 are matched, which facilitate the electrical connection of the PAD testing point on the product to be tested or the PAD testing point on the PCB board, thus improving a convenience.

With reference to FIG. 1, FIG. 2, and FIG. 3, in some embodiments of the present disclosure, the first connecting end 220, the second connecting end 230, and the elastic deformation portion 210 are of an integral structure. By adopting the integral structure, both contact impedance and interference during testing can be avoided, thereby the entire elastic terminal 200 can be controlled to have a resistance value of about 50 mΩ.

With reference to FIG. 5 to FIG. 8, in some embodiments of the present disclosure, the testing device further includes a fixing member 400. The fixing member 400 is provided with a plurality of fixing slots 410 matched with the terminal board 300, and the terminal board 300 is embedded in the corresponding fixing slot 410. The fixing member 400, the terminal board 300, and the arc-shaped groove 320 are matched, then a plurality of testing holes distributed at equal intervals may be formed in an upper surface and a lower surface of the fixing member 400, and two ends of the elastic terminal 200 may be placed in the corresponding testing holes to realize electrical contact with the PAD testing point of the product to be tested.

Figure 6:
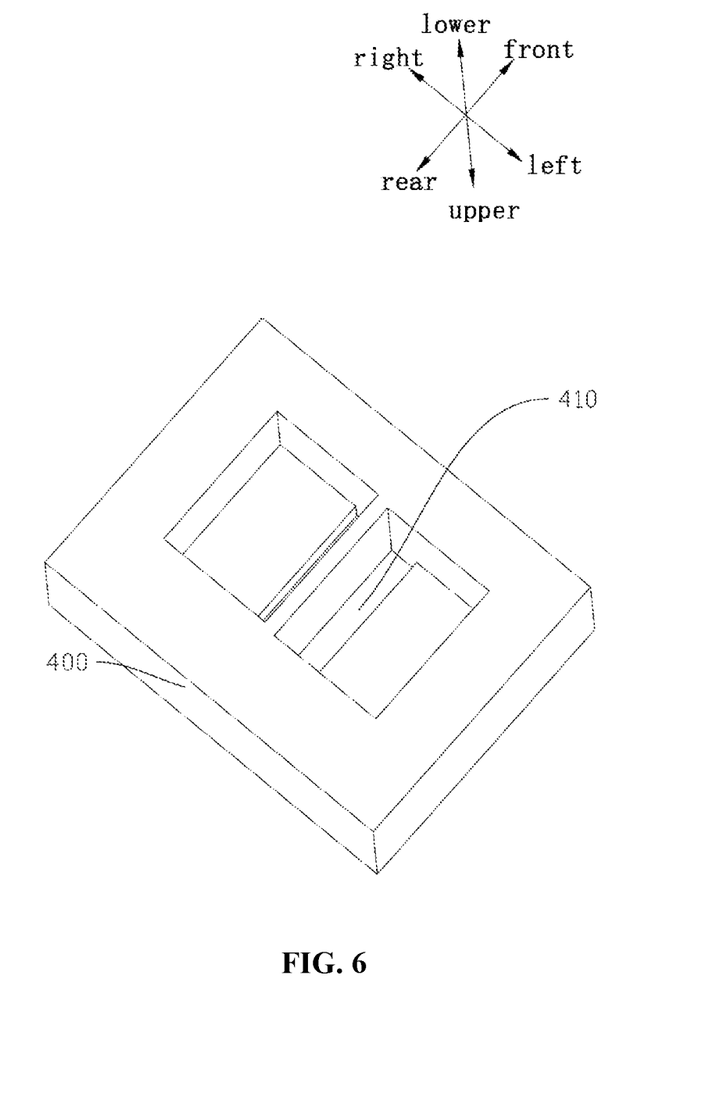
FIG. 6 is a schematic diagram of a structure of a fixing member of the testing device shown in FIG. 5.
Figure 7:
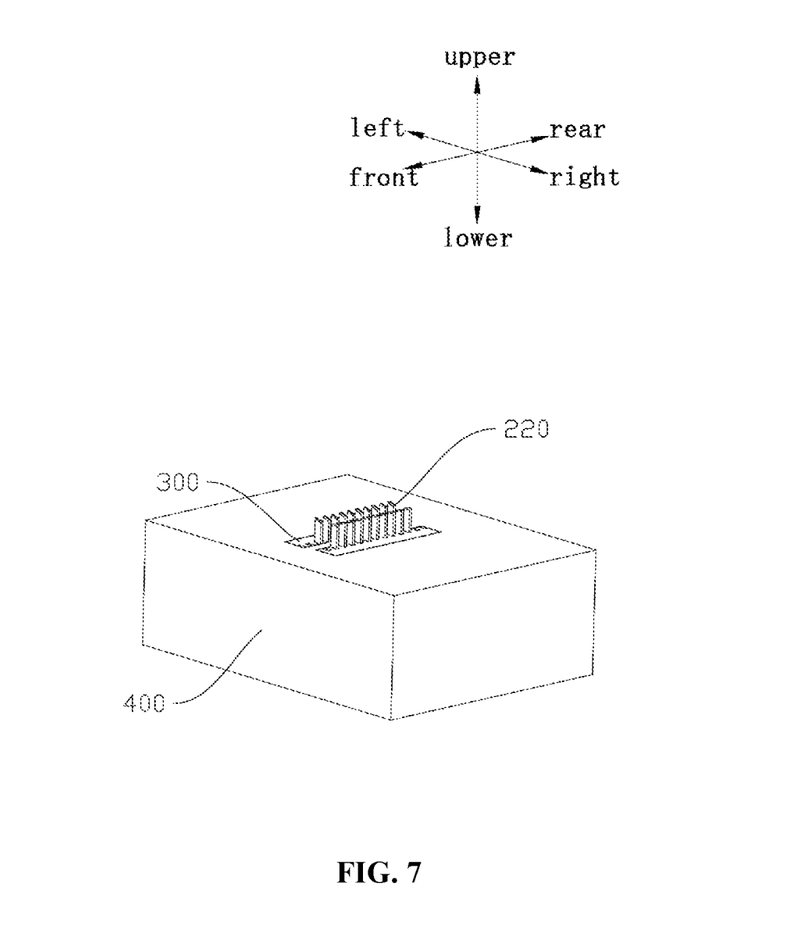
FIG. 7 is a schematic diagram of the testing device shown in FIG. 1 in an assembly state.
Figure 8:
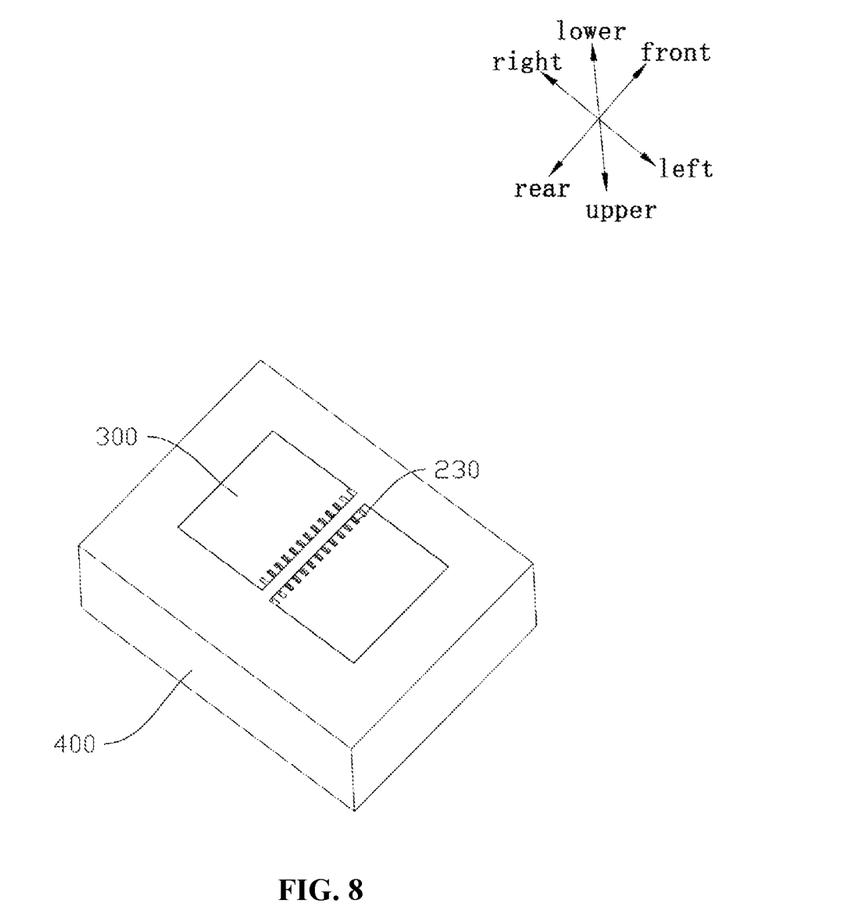
FIG. 8 is a schematic diagram of a structure of the testing device shown in FIG. 7 from another view.

With reference to FIG. 6, in some embodiments of the present disclosure, every two fixing slots 410 in the fixing member 400 are arranged side by side. By adopting the side-by-side mode, a set of testing devices adapted to products to be tested may be formed to be matched with electrical test of the corresponding product to be tested, thus improving an efficiency of a subsequent test.

In some embodiments of the present disclosure, the elastic member 100 is made of silica gel, rubber, or epoxy resin. The elastic member 100 made of silica gel, rubber, or epoxy resin not only has a corresponding insulation performance, but also has a corresponding elasticity, so as to provide a resilience for the elastic terminal 200.

In some embodiments of the present disclosure, a conductive coating layer is coated on a surface of the elastic terminal 200. Coating of the conductive coating layer can improve conductivity performance of the elastic terminal 200, thus improving testing accuracy.

According to some embodiments of the present disclosure, the conductive coating layer is at least one of gold, platinum, silver, copper, aluminum, iron, beryllium, rhodium, palladium alloy, nickel alloy, graphene, or graphite. According to parameters during testing, a suitable material may be selected as the conductive coating layer to improve reliability of conductive transmission.

The present disclosure is described in detail hereinafter by a specific embodiment with reference to FIG. 5 to FIG. 8. It is understood that the following description is only illustrative, and is not a specific limitation of the present disclosure. In the embodiment, one fixing member 400, two terminal boards 300, and two elastic members 100 are provided. A total of ten elastic terminals 200 are clamped on each elastic member 100, and the terminal boards 300 are provided with the corresponding recesses 310 and the arc-shaped grooves 320 arranged on the recesses 310. The elastic terminal 200 is arc-shaped. An upper end of the elastic terminal 200 is a first connecting end 220, a lower end of the elastic terminal 200 is a second connecting end 230. When the elastic terminal 200 is embedded in the corresponding arc-shaped groove 320, the first connecting end 220 extends out of the upper surface 301 of the terminal board 300, and the second connecting end 230 extends out of the lower surface 302 of the terminal board 300. After the elastic terminals 200 and the elastic members 100 are fixed on the corresponding terminal boards 300, the two terminal boards 300 are inserted into the corresponding fixing slots 410 of the fixing member 400. The first connecting end 220 and the second connecting end 230 exposed outside the fixing member 400 are matched, which facilitate the electrical connection of the PAD testing point on the product to be tested or the PAD testing point on the PCB board, thus improving a convenience.

The testing device according to the embodiment of the present disclosure has at least some effects as follows. By using the arc-shaped elastic terminal 200, the elastic recovery effect can be realized, and meanwhile, the total resistance value can be avoided from being excessively large due to the fact that the contact impedance can be avoided, and the electromagnetic interference will not occur, thereby reducing interference. By using the elastic member 100, the resilience for the elastic terminal 200 can be better provided, and the elastic life of the elastic terminal 200 can be further improved. By using the terminal board 300, the elastic terminals can be fixed and isolated, a product to be tested can be positioned and installed. Meanwhile, by using connection modes of clamping and embedding, the assembly can be simplified. The testing device has a simple structure and a high overall reliability.

In the description of the present disclosure, the descriptions referring to terms "an embodiment", "some embodiments", "schematic embodiments", "examples", "specific examples", or "some examples" means that the specific features, structures, materials, or characteristics described in combination with the embodiment or example are included in at least one embodiment or example of the present disclosure. In the description, the schematic representation of the above terms does not necessarily mean the same embodiment or example. Moreover, the specific features, structures, materials or characteristics described may be combined in any one or more embodiments or examples in a suitable manner.

Although the embodiments of the present disclosure have been shown and described, those of ordinary skills in the art may understand that various changes, modifications, substitutions and variations may be made to these embodiments without departing from the principle and purpose of the present disclosure, and the scope of the present disclosure is defined by the claims and their equivalents.

What is claimed is:

1. A testing device, comprising:
   a plurality of elastic members;
   a plurality of elastic terminals each provided with an arc-shaped elastic deformation portion, wherein at least one of the elastic terminals is arranged as one set and is clamped on one of the elastic members with an inner arc of the elastic deformation portion; and a plurality of terminal boards, wherein each of the terminal boards is provided with a recess for accommodating one of the elastic members, the recess is provided with at least one arc-shaped groove each matched with a respective one of the elastic terminals, an outer arc of the elastic deformation portion is embedded in a respective one of the at least one arc-shaped groove, each of the at least one arc-shaped groove has an upper end extending to an upper surface of the terminal board, and a lower end extending to a lower surface of the terminal board.

2. The testing device according to claim 1, wherein at least two of the elastic terminals are arranged as one set and are clamped on one of the elastic members in parallel; and each of the terminal boards is provided with at least two parallel arc-shaped grooves, in each of which a respective one of the at least two of the elastic terminals is embedded.

3. The testing device according to claim 1, further comprising a fixing member, wherein the fixing member is provided with a plurality of fixing slots, each matched with a respective one of the terminal boards embedded in the fixing slot.

4. The testing device according to claim 3, wherein every two fixing slots in the fixing member are arranged side by side.

5. The testing device according to claim 1, wherein each of the elastic terminals has an upper end as a first connecting end and a lower end as a second connecting end, when the elastic terminal is embedded in a corresponding arc-shaped groove, the first connecting end extends out of the upper surface of the terminal board, and the second connecting end extends out of the lower surface of the terminal board.

6. The testing device according to claim 5, wherein the first connecting end, the second connecting end, and the elastic deformation portion are of an integral structure.

7. The testing device according to claim 1, wherein the elastic member is made of silica gel, rubber, or epoxy resin.

\* \* \* \* \*